(12) United States Patent
Becker

(10) Patent No.: US 12,021,309 B2
(45) Date of Patent: Jun. 25, 2024

(54) SIMULTANEOUS MULTI-POLARIZATION RECEIVING WITH CROSS-POLARIZATION INTERFERENCE CANCELLATION

(71) Applicant: Hughes Network Systems, LLC, Germantown, MD (US)

(72) Inventor: Neal D. Becker, Olney, MD (US)

(73) Assignee: Hughes Network Systems, LLC, Germantown, MD (US)

(*) Notice: Subject to any disclaimer, the term of this patent is extended or adjusted under 35 U.S.C. 154(b) by 186 days.

(21) Appl. No.: 17/557,832

(22) Filed: Dec. 21, 2021

(65) Prior Publication Data

US 2023/0041740 A1 Feb. 9, 2023

Related U.S. Application Data

(60) Provisional application No. 63/231,103, filed on Aug. 9, 2021.

(51) Int. Cl.
*H01Q 25/00* (2006.01)
*H03H 21/00* (2006.01)
*H04B 7/10* (2017.01)

(52) U.S. Cl.
CPC ...... *H01Q 25/001* (2013.01); *H03H 21/0012* (2013.01); *H04B 7/10* (2013.01); *H03H 2021/0058* (2013.01)

(58) Field of Classification Search
CPC ......... H01Q 25/001; H03H 2021/0058; H03H 21/0012; H04B 7/10
See application file for complete search history.

(56) References Cited

U.S. PATENT DOCUMENTS 6,731,704 B1  5/2004  Kiyanagi
8,396,177 B1 * 3/2013  Morris .............. H04L 25/03019
                                                375/229
(Continued)

FOREIGN PATENT DOCUMENTS

EP    0 553 873 A1    8/1993

OTHER PUBLICATIONS

International Search Report and Written Opinion for PCT/US2022/039579 mailed Jan. 2, 2023, all pages.
(Continued)

Primary Examiner — Nguyen T Vo
(74) Attorney, Agent, or Firm — Kilpatrick Townsend & Stockton LLP

(57) ABSTRACT

Techniques described herein provide cancelation of cross-polarization interference during simultaneous receipt of radiofrequency signals (e.g., an X-signal and a Y-signal) in a same frequency channel in nominally orthogonal polarizations. Though nominally orthogonally polarized, each signal contributes some cross-polarization interference to the other. Embodiments receive and demodulate each signal by a corresponding demodulator to generate corresponding X-symbol and Y-symbol decision signals, referenced to a common clock domain. An X-channel adaptive canceler (X-CAC) generates an X-output signal by using one or more Y-symbol decision signals adaptively to cancel cross-polarization interference from the Y-signal, and a Y-CAC generates a Y-output signal by using one or more X-symbol decision signals adaptively to cancel cross-polarization interference from the X-signal (e.g., the X-CAC and the Y-CAC each using a first-order least mean squares control loop). The resulting X-output signal and Y-output signal can be further decoded and output by the receiver to downstream systems and/or components.

19 Claims, 6 Drawing Sheets

(56) References Cited

U.S. PATENT DOCUMENTS

| | | | | |
|---|---|---|---|---|
| 2004/0205438 A1* | 10/2004 | Chien | ................... | H03M 13/00 |
| | | | | 714/746 |
| 2013/0065547 A1* | 3/2013 | Suzuki | ..................... | H04B 7/10 |
| | | | | 455/230 |
| 2013/0216012 A1* | 8/2013 | Weinholt | .............. | H04L 7/0016 |
| | | | | 375/347 |
| 2014/0206291 A1* | 7/2014 | Ichikawa | .............. | H04L 1/0003 |
| | | | | 455/63.1 |
| 2015/0098534 A1* | 4/2015 | Meller | .............. | H04L 27/26526 |
| | | | | 375/350 |

OTHER PUBLICATIONS

Jana Mrinmoy et al., "Interference and Phase Noise Mitigation in a Dual-Polarized Faster-than-Nyquist Transmission," 2018 IEEE 19th International Workshop on Signal Processing Advances in Wireless Communications (SPAWC), IEEE, Jun. 25, 2018, pp. 1-5, XP033391795, DOI: 10.1109/SPAWC.2018.8445889 paragraphs [00I]-[0III]; figures 1-3.

* cited by examiner

SIMULTANEOUS MULTI-POLARIZATION RECEIVING WITH CROSS-POLARIZATION INTERFERENCE CANCELLATION

CROSS-REFERENCE TO RELATED APPLICATIONS

This application claims priority to U.S. Provisional Patent Application No. 63/231,103, filed on Aug. 9, 2021, entitled "Cancellation Of Cross-Pole Interference," the disclosure of which is hereby incorporated by reference in its entirety for all purposes.

FIELD

Embodiments relate generally to radiofrequency receivers; and, more particularly, to cancelation of cross-polarization interference during simultaneous receipt of radiofrequency signals in multiple orthogonal polarizations.

BACKGROUND

In radiofrequency communication networks, signals are typically transmitted by transmitters and received by receivers according to particular polarization orientations (referred to herein as "polarization" for simplicity). For example, a satellite communication signal can be transmitted and received using vertical polarization, horizontal polarization, right-hand circular polarization, left-hand circular polarization, etc. Even though a particular signal may be transmitted in a single polarization, receipt of the signal may be impacted by interference both in the same polarization and in one or more other polarizations. Interference received in polarizations other than the polarization of the signal can be referred to as cross-polarization interference.

Some radiofrequency communication networks simultaneously communicate one or more signals over a single frequency channel in multiple (e.g., two) polarizations, such as to maximize spectral efficiency. In theory, the multiple polarizations are precisely orthogonal, so that the simultaneous communications do not mutually interfere. However, in real-world applications, the multiple communications tend not to be precisely orthogonal, and each communication becomes a source of cross-polarization interference to the other or others. For example, signals are simultaneously transmitted in vertical polarization over a first channel and in horizontal polarization over a second channel. The signals received over the first channel will tend to include both the vertically polarized signal and horizontally polarized interference from the second channel, and the signal received over the second channel will tend to include both the horizontally polarized signal and vertically polarized interference from the second channel. The cross-polarization interference can tend to degrade the receiver performance, such as by increasing symbol error rate and degrading signal-to-noise ratio (SNR).

SUMMARY

Embodiments described herein provide cancelation of cross-polarization interference during simultaneous receipt of radiofrequency signals in multiple orthogonal polarizations. For example, a radiofrequency receiver simultaneously receives an X-signal in a first polarization and a Y-signal in a second polarization over a same frequency channel. Even though the polarizations are nominally orthogonal, each signal contributes some cross-polarization interference to the other. Each signal is received and demodulated by a corresponding demodulator to generate corresponding X-symbol and Y-symbol decision signals, both referenced to a common clock domain. An X-channel adaptive canceler generates an X-output signal by using one or more Y-symbol decision signals adaptively to cancel the cross-polarization interference produced by the Y-signal, and a Y-channel adaptive canceler generates a Y-output signal by using one or more X-symbol decision signals adaptively to cancel the cross-polarization interference produced by the X-signal. The resulting X-output signal and Y-output signal can be further decoded and output by the receiver to downstream systems and/or components.

According to one set of embodiments, a system is provided for cancelation of cross-polarization interference in a radiofrequency receiver that simultaneously receives an X-signal in a first polarization and a Y-signal in a second polarization over a same frequency channel. The first polarization is nominally orthogonal to the second polarization. The system includes: an X-demodulator to receive an X-input signal and to generate one or more X-symbol decision signals at an X-symbol decision output based on the X-input signal, the X-input signal being the X-signal with Y-cross-polarization interference contributed by interference from the Y-signal; a Y-demodulator to receive a Y-input signal and to generate one or more Y-symbol decision signals at a Y-symbol decision output based on the Y-input signal, the Y-input signal being the Y-signal with X-cross-polarization interference contributed by interference from the X-signal; an X-channel adaptive canceler (X-CAC) coupled with the X-demodulator and the Y-demodulator, and configured to apply the Y-symbol decision output to an X-feedback control loop to adaptively cancel contributions of the Y-cross-polarization interference from the X-symbol decision output to generate an X-output signal; and a Y-channel adaptive canceler (Y-CAC) coupled with the X-demodulator and the Y-demodulator, and configured to apply the X-symbol decision output to a Y-feedback control loop to adaptively cancel contributions of the X-cross-polarization interference from the Y-symbol decision output to generate a Y-output signal.

According to another set of embodiments, a method is provided for cancelation of cross-polarization interference in a radiofrequency receiver that simultaneously receives an X-signal in a first polarization and a Y-signal in a second polarization over a same frequency channel. The first polarization is nominally orthogonal to the second polarization. The method includes: receiving an X-input signal as the X-signal with Y-cross-polarization interference contributed by interference from the Y-signal; receiving a Y-input signal as the Y-signal with X-cross-polarization interference contributed by interference from the X-signal; generating one or more X-symbol decision signals at an X-symbol decision output based on the X-input signal; generating one or more Y-symbol decision signals at a Y-symbol decision output based on the Y-input signal; generating an X-output signal by applying the Y-symbol decision output to an X-feedback control loop to adaptively cancel contributions of the Y-cross-polarization interference from the X-symbol decision output; and generating a Y-output signal by applying the X-symbol decision output to a Y-feedback control loop to adaptively cancel contributions of the X-cross-polarization interference from the Y-symbol decision output.

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and embodiments, will become more apparent upon referring to the following specification, claims, and accompanying drawings.

BRIEF DESCRIPTION OF THE DRAWINGS

The present disclosure is described in conjunction with the appended figures.

Figure 1:
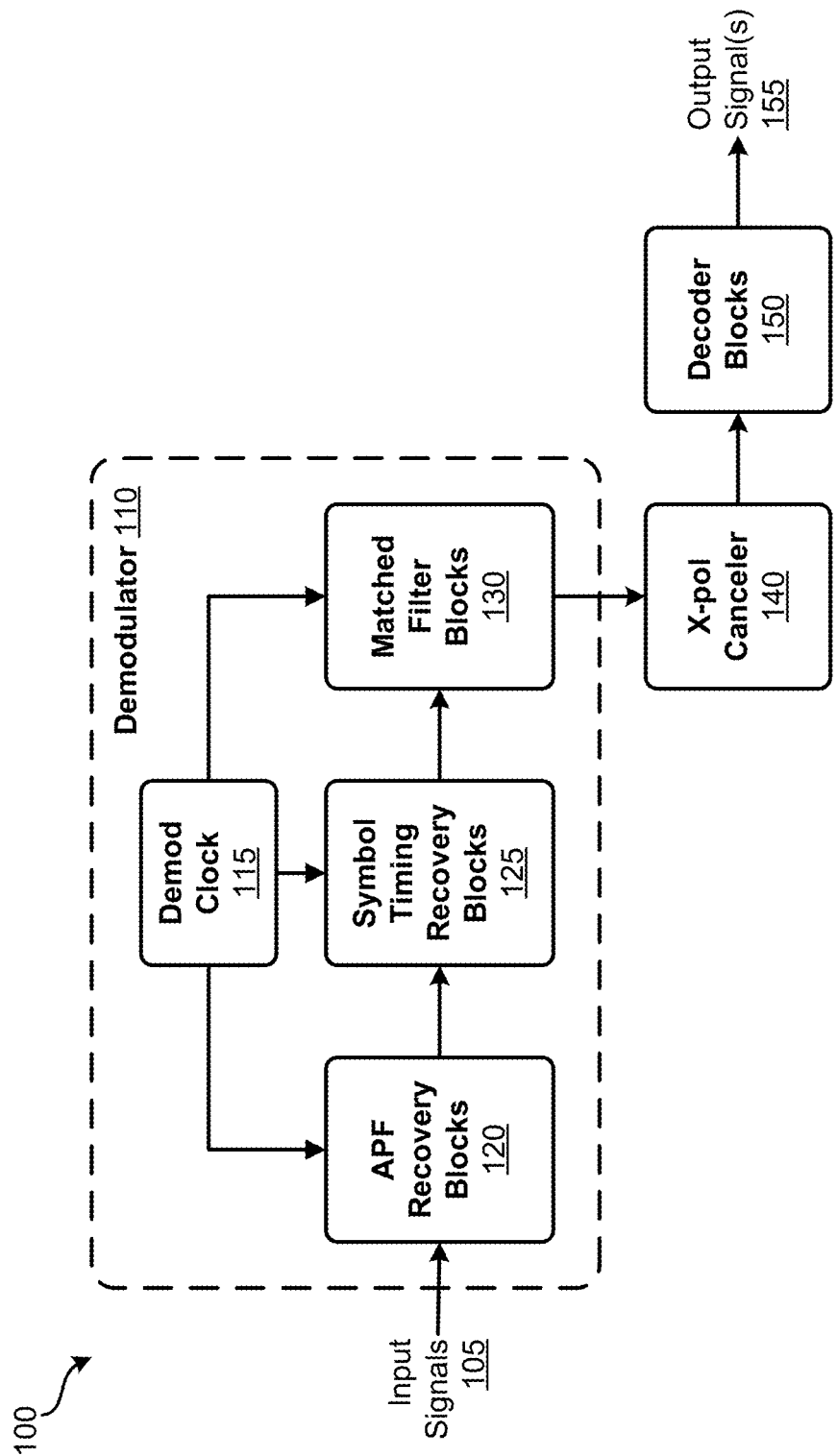
FIG. 1 shows a simplified block diagram of a radiofrequency receiver.

In the appended figures, similar components and/or features may have the same reference label. Further, various components of the same type may be distinguished by following the reference label by a second label (e.g., a lower-case letter) that distinguishes among the similar components. If only the first reference label is used in the specification, the description is applicable to any one of the similar components having the same first reference label irrespective of the second reference label.

DETAILED DESCRIPTION

Embodiments of the disclosed technology will become clearer when reviewed in connection with the description of the figures herein below. In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

Some radiofrequency communication networks simultaneously communicate signals over a single frequency channel in multiple (e.g., two) polarizations, such as to maximize spectral efficiency. In theory, the multiple polarizations are precisely orthogonal, so that the simultaneous communications do not mutually interfere. However, in real-world applications, the multiple communications tend not to be precisely orthogonal, such that each communication becomes a source of cross-polarization interference to the other or others. In effect, the receiver simultaneously receives the signals via two receive paths that are mutually interfering. Such mutual interference due to cross-polarization can tend to degrade the receiver performance, such as by increasing symbol error rate and degrading signal-to-noise ratio (SNR).

Embodiments described herein include techniques for canceling (e.g., substantially eliminating) such cross-polarization interference in receivers that simultaneously receive signals over a same frequency channel in multiple polarizations. For example, two receive paths (X and Y) correspond to two nominally orthogonal polarizations. For example, a X-channel received signal corresponds a first (e.g., vertically) polarized transmission of the signal, and a Y-channel received signal corresponds a second (e.g., horizontally) polarized transmission of the signal. Each channel's signal has a respective signal characteristics (e.g., delay offset, amplitude, frequency offset, etc.); and each channel is affected by cross-polarized interference contributions from the other channel that also have respective signal characteristics. Each of an X-demodulator and a Y-demodulator receives a respective one of the X-channel signal and the Y-channel signal and generates X-channel symbol decision signals and Y-channel symbol decision signals, respectively, based on estimates of their respective received signal and cross-polarization interference characteristics. An X-channel adaptive canceler (X-CAC) uses the Y-channel symbol decision signals to cancel cross-polarization interference from the Y-channel, and a Y-channel adaptive canceler (Y-CAC) uses the X-channel symbol decision signals to cancel cross-polarization interference from the X-channel. The interference-canceled signals output by the X-CAC and the Y-CAC can be decoded into a digital output signal for output by the receiver (e.g., to a media receiver and/or playback device).

FIG. 1 shows a simplified block diagram of a radiofrequency receiver 100. In a modern radiofrequency communication network, data streams (e.g., streams of digital bits) may be encoded into analog signals according to some defined protocol or protocols, and the analog signals may be communicated wirelessly over one or more carrier frequencies (i.e., one or more frequency channels) at one or more polarizations. A receiving antenna (not shown) tuned to a particular carrier frequency and oriented to a particular polarization can receive analog signals transmitted over that carrier frequency and in that polarization.

As noted above, embodiments described herein operate in context of simultaneous receipt of signals at multiple (e.g., two) nominally orthogonal polarizations. The term "nominal" (or "nominally", or the like) refers to the designed intent of the condition with the recognition that a real-world implementation will likely (or even certainly) fail to precisely meet the condition. For example, a communication system can be designed to transmit a first signal in a nominally vertical polarization orientation and a second signal in a nominally horizontal polarization orientation, such that the signals are nominally orthogonally polarized and do not interfere. Anyone of skill in the art will recognize, however, that it may be impractical or impossible to produce and/or maintain perfect orthogonality, and the two signals will tend to interfere by cross-polarization interference. As such, reference herein to a first polarization that is nominally orthogonal to a second polarization," or the like, conveys that the two polarizations are intended by design to be orthogonal with the recognition that perfect orthogonality will not be attainable and some cross-polarization interference will occur.

In this context, at least two analog signals will be received over the radiofrequency channel in different polarizations. As illustrated, the radiofrequency receiver 100 receives the transmitted analog signals as multiple input signals 105 and generates one or more output signals 155 for use by other components. For example, in a satellite television network, a digital bit stream representing digital television content can be encoded onto multiple, nominally orthogonal analog transmissions and received over the radiofrequency channel by the radiofrequency receiver 100 as the input signals 105. The radiofrequency receiver 100 can process the received input signals 105 to recover and decode the digital bit stream, which it can then send as the output signal(s) 155 to a digital television, or other digital media storage or playback appliance.

As illustrated, the received input signals 105 can be received at the input to a demodulator 110. The demodulator 110 can include a demodulator clock 115, amplitude/phase/frequency (APF) recovery blocks 120, symbol timing recovery blocks 125, and matched filter blocks 130. As described below, the matched filter blocks 130 can be implemented as part of the symbol timing recovery blocks 125. Some embodiments of the demodulator 110 can include additional components, such as additional analog-to-digital converters (ADCs), filters, amplifiers, controllers, etc. As illustrated, the input signals 105 can initially be passed to the APF recovery blocks 120, which can estimate the amplitude, phase, and/or frequency of the input signals 105 and can normalize the input signals 105, accordingly. For example, subsequent blocks of the radiofrequency receiver 100 may be designed to operate at (e.g., to expect) a particular amplitude, phase, and/or frequency.

The normalized input signals 105 can be passed to the symbol timing recovery blocks 125 and the matched filter blocks 130. The symbol timing recovery blocks 125 can sample the normalized input signals 105 to estimate a stream of symbols (e.g., bits) encoded by the input signals 105. The matched filter blocks 130 can attempt to correlate a template signal to the estimated symbol stream of the normalized input signals 105 (e.g., by computing a convolution of the normalized input signals 105 with a time-reversed conjugate of the template signal) in a manner that seeks to maximize signal-to-noise ratio (SNR). While the illustrated configuration shows the symbol timing recovery blocks 125 as a separate block prior to the matched filter blocks 130, features of those blocks can be performed in any suitable manner. For example, as described below, the matched filter blocks 130 can be implemented as part of the symbol timing recovery blocks 125.

Embodiments of the demodulator clock 115 can effectively establish a receiver clock domain. For example, symbols are encoded in the input signals 105 at a particular symbol rate, and the receiver clock domain can have a frequency that is some integer multiple of the symbol rate. The APF recovery blocks 120, symbol timing recovery blocks 125, and matched filter blocks 130 can be coupled with the demodulator clock 115, so that recovery of the symbol stream from the input signals 105 is synchronized with the receiver clock domain. In some conventional radiofrequency receivers, similar techniques can be used to estimate a symbol stream from a single input signal received at a single polarization. Such conventional implementations may not tend to experience appreciable amounts of cross-polarization interference, such that a recovered symbol stream can be passed directly to a decoder for generation of an output signal. In the contexts described herein, however, each of the input signals 105 is afflicted with cross-polarization interference from others of the input signals 105, which can impact the reliability of symbol estimation.

As such, the output of the demodulator 110 (i.e., one or more signals representing an estimated symbol stream derived from each of the input signals 105) is passed to a cross-polarization (x-pol) canceler 140. As described herein, embodiments of the x-pol canceler 140 can use feedback loops to cancel contributions of cross-polarization interference from the demodulator 110 output signals, thereby producing recovered estimated symbol streams that are cross-polarization-canceled. The outputs from the x-pol canceler 140 (i.e., the cross-polarization-canceled recovered estimated symbol streams) can be passed to one or more decoder blocks 150 for generation of the output signal(s) 155. For example, as noted above, content can be encoded as a digital bit stream, and the digital bit stream can be encoded onto the transmitted radiofrequency signals that are ultimately received as the input signals 105. Part of encoding the signals for transmission typically involves adding additional symbols (e.g., bits) in accordance with one or more data and/or communication protocol definitions. For example, the digital data may be packetized with additional overhead, such as into data packets that each include a preamble, post-amble, mid-amble, etc.; and/or with additional data to support modulation and/or encoding schemes that help tailor the robustness of the communication to packet loss, and/or other concerns. For these and other reasons, generation of the output signal 155 by the decoder blocks 150 can involve stripping off protocol-defined overhead, and/or otherwise decoding (e.g., and possibly re-encoding) the symbol stream according to protocol definitions, to generate suitable output signal(s) 155 for use by downstream components.

Figure 2:
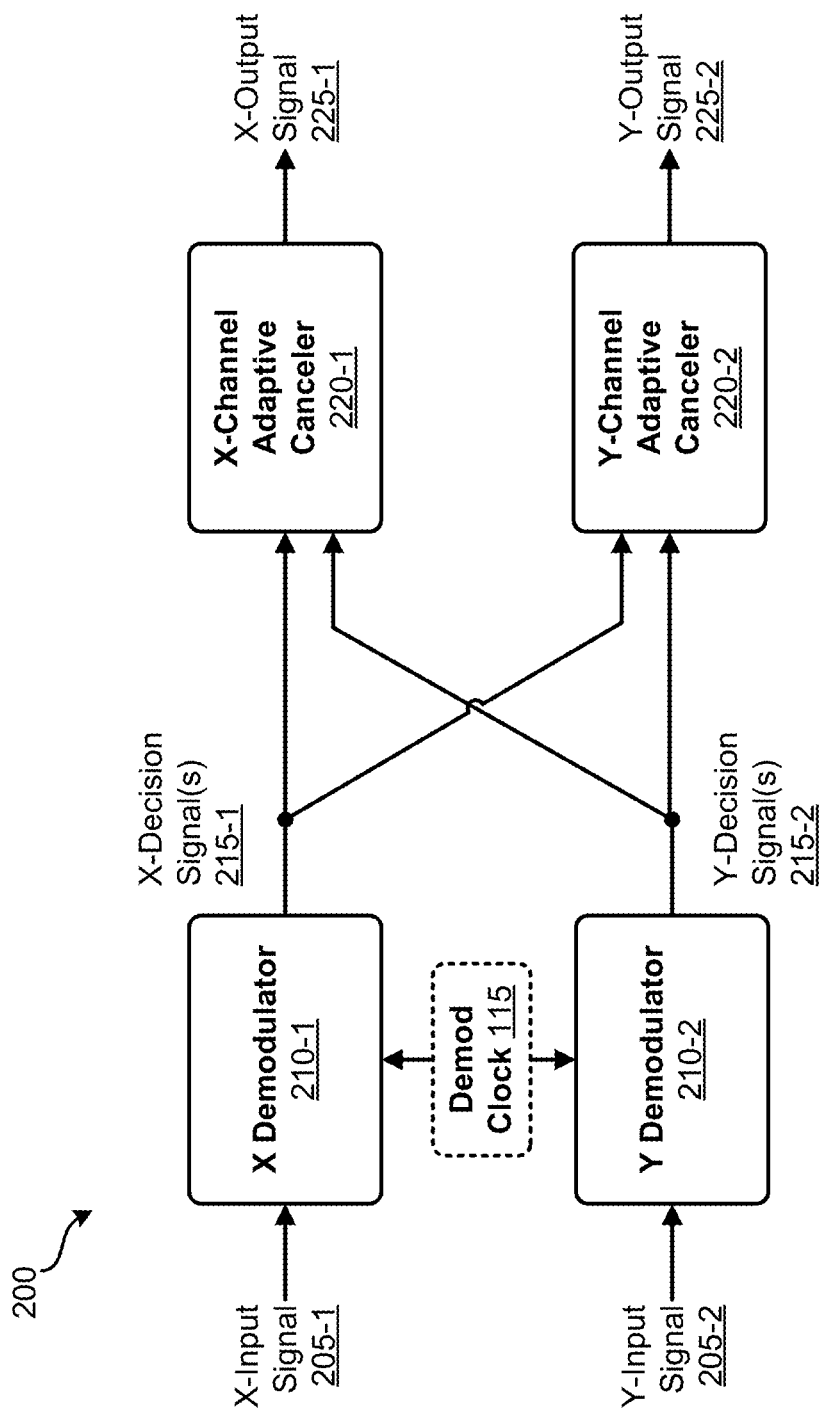
FIG. 2 shows another high-level block diagram of a partial radiofrequency receiver, according to various embodiments described herein.

While FIG. 1 shows the demodulator 110 and the x-pol canceler 140 each as a single box, each is implemented to support multiple receive paths for the multiple input signals 105. FIG. 2 shows another high-level block diagram of a partial radiofrequency receiver 200, according to various embodiments described herein. The partial radiofrequency receiver 200 can be a partial implementation of the radiofrequency receiver 100 of FIG. 1 (e.g., without the decoder blocks 150). For example, as illustrated in FIG. 2, the demodulator 110 of FIG. 1 can be implemented as an X-demodulator 210-1 and a Y-demodulator 210-2, and the x-pol canceler 140 of FIG. 1 can be implemented as an X-channel adaptive canceler and a Y-channel adaptive canceler.

The illustrated implementation specifically shows the X-channel adaptive canceler implemented as an X-channel least mean squares (LMS) canceler (X-LMSC) 220-1, and the Y-channel adaptive canceler implemented as a Y-channel LMS canceler (Y-LMSC) 220-2. Such implementations generally suggest that each LMSC 220 includes one or more control loops to adaptively cancel cross-polarization interference, and that each control loop generally generates an error (corresponding to the cross-polarization interference), integrates and attenuates the error, and generates a feedback signal based on the error to cancel the cross-polarization interference. In some such implementations, each control loop can implement such features as a first-order control loop. Even though various embodiments are illustrated and described herein with specific reference to LMS-based cancelers (i.e., X-LMSCs and Y-LMSCs) with first-order control loops, etc., it will be appreciated that other types of adaptive control can be used to implement the cross-polarization noise cancelation. For example, the X-channel and Y-channel adaptive cancelers can be implemented using non-LMS-based adaptive control techniques and/or using higher-order (e.g., second-order) control loops, or in any other suitable manner.

To avoid over-complicating the figures and descriptions, embodiments are discussed in context of simultaneously receiving two input signals 205 over a same frequency channel. Each of the input signals 205 is simultaneously communicated in a respective one of two nominally orthogonal polarization orientations. Techniques described herein can be extended to contexts where more than two input signals are simultaneously received. As illustrated, the first input signal can be referred to as the "X-input" signal 205-1, and the second input signal can be referred to as the "Y-input" signal 205-2. Though the input signals 205 are nominally orthogonal, each includes cross-polarization interference from the other. For the sake of convention, the description herein refers to an "X-signal" as a first encoded data signal as it traverses the radiofrequency channel in a first of the nominally orthogonal polarizations, and a "Y-signal" as a second encoded data signal as it traverses the radiofrequency channel in the second of the nominally orthogonal polarizations. The received X-input signal 205-1 includes the X-signal and cross-polarization interference contributed by interference from the Y-signal, and the received Y-input signal 205-2 includes the Y-signal and cross-polarization interference contributed by interference from the X-signal.

The X-input signal 205-1 is received by the X-demodulator 210-1, and the Y-input signal 205-2 is received by the Y-demodulator 210-2. The X-demodulator 210-1 and the Y-demodulator 210-2 can be referenced to a same demodulator clock domain. For example, the X-demodulator 210-1 and the Y-demodulator 210-2 can be coupled to, and clocked according to, a same demodulator clock 115, such as described with reference to FIG. 1. Each demodulator 210 can generate one or more decision signals 215 (also referred to herein as "symbol decision signals"), such as a soft decision signal, a hard decision signal, a known decision signal, etc. In particular, the X-demodulator 210-1 generates and outputs one or more X-decision signals 215-1 (or "X-symbol decision signals") based on the X-input signal 205-1, and the Y-demodulator 210-2 generates and outputs one or more Y-decision signals 215-2 (or "Y-symbol decision signals") based on the Y-input signal 205-2.

The X-decision signals 215-1 and the Y-decision signals 215-2 can be used by the LMSCs 220 to cancel cross-polarization interference from the X-decision signals 215-1 and the Y-decision signals 215-2, respectively. As noted above, the X-input signal 205-1 includes cross-polarization interference contributions from the Y-signal ("Y-cross-polarization interference"). As such, the X-decision signals 215-1 (i.e., representing the estimated symbol stream as recovered from the X-input signal 205-1) also include Y-cross-polarization interference contributions. The X-LMSC 220-1 is coupled with both the X-demodulator 210-1 and the Y-demodulator 210-2. The X-LMSC 220-1 applies one or more of the Y-decision signals 215-2 (received from the Y-demodulator 210-2) to an X-feedback control loop to adaptively cancel contributions of the Y-cross-polarization interference from the X-decision signals 215-1 (received from the X-demodulator 210-1) to generate an X-output signal 225-1. Similarly, the Y-input signal 205-2 includes cross-polarization interference contributions from the X-signal ("X-cross-polarization interference"), and thus the Y-decision signals 215-2 (i.e., representing the estimated symbol stream as recovered from the Y-input signal 205-2) also includes X-cross-polarization interference contributions. The Y-LMSC 220-2 is coupled with both the X-demodulator 210-1 and the Y-demodulator 210-2. The Y-LMSC 220-2 applies one or more of the X-decision signals 215-1 (received from the X-demodulator 210-1) to a Y-feedback control loop to adaptively cancel contributions of the X-cross-polarization interference from the Y-decision signals 215-2 (received from the Y-demodulator 210-2) to generate a Y-output signal 225-2.

As described herein, each of the X-control loop of the X-LMSC 220-1 and the Y-control loop of the Y-LMSC 220-2 can be implemented as a least mean squares (LMS) first-order control loop. For example, such a loop can generally use negative feedback to adaptively converge on a set of component parameters that optimizes cancelation of interference from the cross-polarization interference. The converged-upon parameters can be dynamically updated with any changes in characteristics of the interference. In some embodiments, the decision signals 215 are oversampled so that there are multiple samples for each estimated recovered symbol, each having its own corresponding sample timing. In some such embodiments, the each LMSC 220 can implement its respective control loop as multiple control loops that each seeks to cancel interference with respect to the sample timing of a respective one of the multiple samples. Some embodiments described herein include additional features, such as to handle frequency offsets between the X-signal and the Y-signal.

Figure 3:
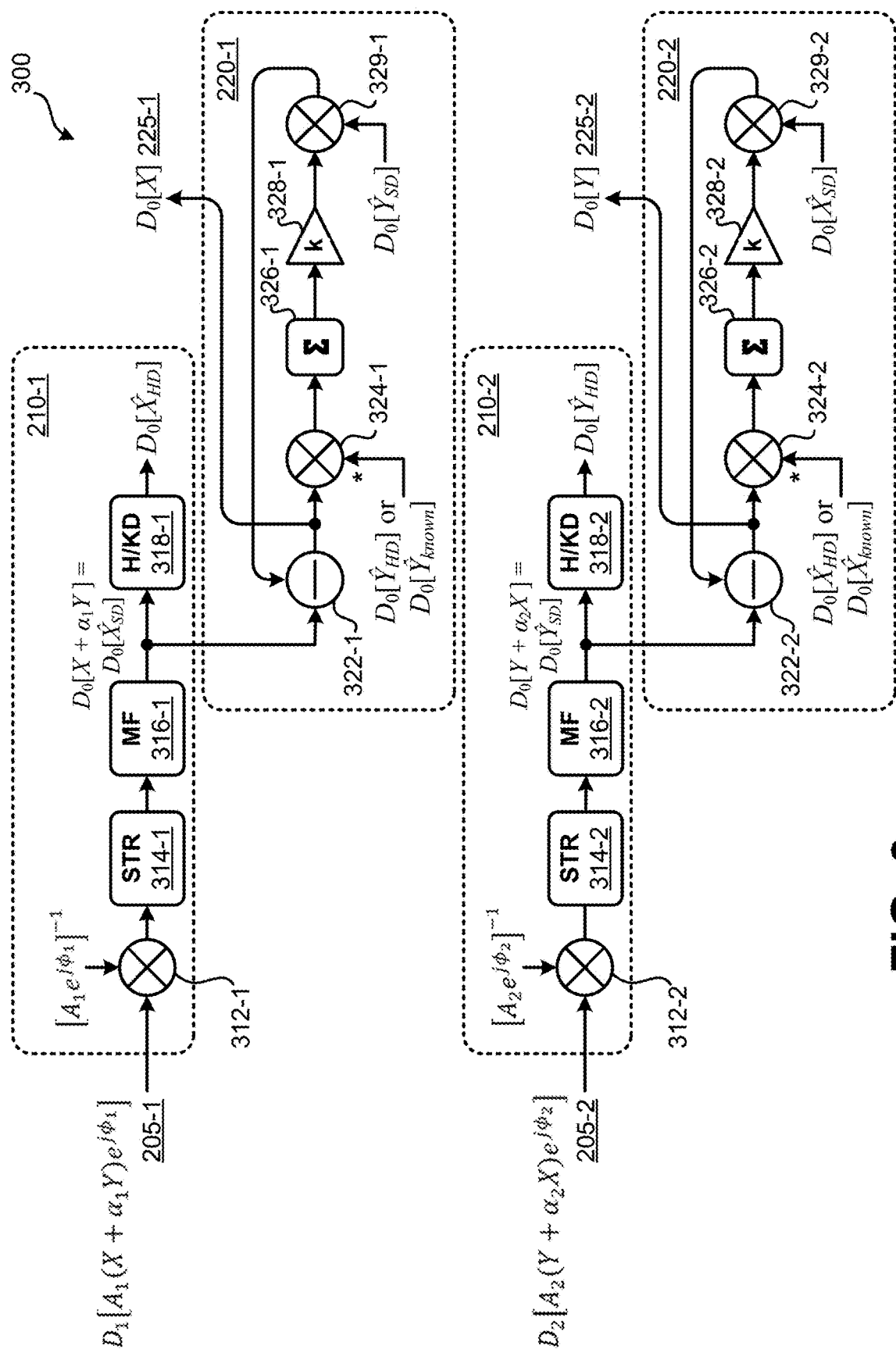
FIG. 3 shows a block diagram of an illustrative implementation of a partial radiofrequency receiver, according to various embodiments described herein.

FIG. 3 shows a block diagram of an illustrative implementation of a partial radiofrequency receiver 300, according to various embodiments described herein. The partial radiofrequency receiver 300 can be an implementation of the partial radiofrequency receiver 200 of FIG. 2. The X-input signal 205-1 is represented as: $D_1[A_1(X+\alpha_1 Y)e^{j\phi^1}]$. As described above, the X-input signal 205-1 includes the X-signal (X) plus cross-polarization interference contributions represented as energy from the Y-signal (Y) attenuated by a complex coefficient ($\alpha_1$). The X-input signal 205-1 is also received at some amplitude ($A_1$), phase ($\phi_1$), and delay ($D_1$). Similarly, the Y-input signal 205-2 is represented by $D_2[A_2(Y+\alpha_2 X)e^{j\phi^2}]$, including the Y plus cross-polarization interference contributions represented as energy from X attenuated by a complex coefficient ($\alpha_2$). The Y-input signal 205-2 is also received at some amplitude ($A_2$), phase ($\phi_2$), and delay ($D_2$). Even though the signals are received nominally simultaneously, there can be a mismatch in the delays of the X-input signal 205-1 and the Y-input signal 205-2 due to various factors. For example, slight differences in cable length between respective receive antennas and the respective demodulators 210 can manifest differences between $D_1$ and $D_2$.

Each demodulator 220 includes a normalizer 312, a symbol timing recovery (STR) block 314, a matched filter (MF) block 316, and a hard/known decision (H/KD) block 318. The normalizer 312 can be an implementation of the APF recovery block 120 of FIG. 1, the symbol timing recovery (STR) block 314 can be an implementation of the symbol timing recovery block 140 of FIG. 1, and the matched filter (MF) block 316 can be an implementation of the matched filter block 130 of FIG. 1. As illustrated, the normalizer 312 can be implemented as a multiplier that generates a normalized input signal based on a complex product of the input signal 205 and the inverse of signal characteristics estimated from the input signal 205. For example, the normalizer 312-1 in the X-demodulator 210-1 estimates and inverts the amplitude and phase of the X-input signal 205-1 as $[A_1 e^{j\phi^1}]^{-1}$, such that performing the complex product effectively normalizes (e.g., cancels) out the amplitude and phase characteristics from the X-input signal 205-1. Similarly, the normalizer 312-2 in the Y-demodulator 210-2 estimates and inverts the amplitude and complex phase of the Y-input signal 205-2 as $[A_2 e^{j\Phi^2}]^{-1}$, such that performing the complex product effectively normalizes (e.g., cancels) out the amplitude and phase characteristics from the Y-input signal 205-2.

In each demodulator 210, the STR block 314 can seek to estimate a recovered symbol stream from the normalized input signal 205. For example, a delay-locked loop can attempt to lock onto peaks, or other features of the input signals 205, to identify symbol timing and symbol boundaries. Though shown as two separate blocks, the STR blocks 314 and the MF blocks 316 work together to generate a "soft decision" (SD) output. In some implementations, the MF blocks 316 are implemented within the STR blocks 314. The input to the STR block 314 is the amplitude- and phase-corrected output from the normalizer 312, which includes an encoded stream of symbols. The STR block 314 seeks to recover the symbol timing, such as by estimating a sampling location (e.g., sample period) until an optimal periodic sample location is achieved. The MF block 316 can then perform template matching, or the like, based on the estimated symbol timing to generate an output that corresponds to a recovered complex sample value. The estimate of the recovered complex sample value can be considered as the SD output. In some implementations, the STR block 314 and the MF block 316 are part of a feedback loop. The STR block includes a symbol timing interpolator coupled with an input to the MF block 316, and the SD output from the MF block 316 is fed back, via a timing error detector and a loop filter, to the symbol timing interpolator. In this way, the symbol timing interpolator can dynamically update its estimate of the symbol timing based on the feedback.

As noted above, the demodulator clock 115 can define a demodulator clock domain (referred to as $D_0$), and the symbol timing recovery by the STR block 314 tends to synchronize the symbol timing of the recovered symbol stream (i.e., of the SD output) to $D_0$. In effect, the STR block 314 tends to add a variable delay to the normalized input signal 205 ($D_1-D_0$ for the X-input signal 205-1, and $D_2-D_0$ for the Y-input signal 205-2), so that subsequent processing of the signals in both the X and Y processing paths can be referenced to $D_0$. As such, the SD output in the X-demodulator 210-1 can effectively be considered as including the X-signal and the interference contribution from the Y-signal (i.e., $\alpha_1 Y$), all referenced to the $D_0$ domain, and the SD output in the Y-demodulator 210-2 can effectively be considered as including the Y-signal and the interference contribution from the X-signal (i.e., $\alpha_2 X$), all referenced to the Do domain. This can be seen in FIG. 3 as the signals at the outputs of MF block 316-1 and 316-2:

$D_0[X+\alpha_1 Y]=D_0[\hat{X}_{SD}]$, and $D_0[Y+\alpha_2 X]=D_0[\hat{Y}_{SD}]$, respectively.

The mutual shift to the same $D_0$ assumes that the two demodulators 210 are referenced to the same clock domain, such as by being coupled with the same demodulator clock 115. Still, the type of delay shifting provided by the STR blocks 314 may only be able to account for slight mismatches between the delays of the input signals 205. In some implementations, the STR blocks 314 may be able to tolerate up to approximately a half-symbol delay adjustment. For example, if the X-input signal 205-1 and the Y-input signal 205-2 are 500 Mega-sample per second (Msps) signals, each symbol is allotted 2 nanoseconds (ns) of symbol time, and such an implementations of the STR blocks 314 would handle up to approximately ±1 ns of mismatch between $D_1$ and $D_2$.

As described with reference to FIG. 2, the output of each demodulator 210 can be one or more decision signals 215. One such decision signal 215 can be the SD signals described above. For example, the signals received as input signals 205 were initially transmitted from digital transmitters. In either of the transmitted signals, any particular symbol (s) can be considered from a set of symbols (S) in the signal (i.e., the symbol can correspond to an integer value from 0 to S−1). The symbol can be mapped to a complex value by a mapping function: $M(s)=z=x+jy$. At the receiver, after adjusting amplitude and phase by the normalizer 312, and after recovering symbol timing and performing matched filtering by the STR block 314 and the MF block 316, a complex value is recovered in the SD output as $z_{SD}=\hat{z} \approx z$, which is an estimate of the recovered symbol. Certain features described herein use this SD output directly as one of the decision signals 215.

In some embodiments, each demodulator 210 includes one or more other types of decision blocks to generate additional and/or different decision signals 215, such as H/KD blocks 318. In some implementations, the H/KD blocks 318 use one or more hard decision decoding techniques to generate a hard decision (HD) signal. Embodiments of the H/KD blocks 318 can generate the HD signal by performing an inverse operation on the SD output to attempt to map each recovered complex value back to a corresponding symbol transmitted by the transmitter. For example, from each recovered complex value, $\hat{z}$, the H/KD blocks 318 can generate a guess as to the corresponding transmitted symbol, $\hat{s}$. The guessed symbol, $\hat{s}$, can be used to reapply the mapping described above to obtain $z_{HD}=M(\hat{s})$. Thus, the SD output can include a stream of samples, each representing a raw complex output value from the MF block 316; and the HD output can include a stream of estimated recovered symbol values obtained by de-mapping SD output samples to a symbol constellation point and then remapping (e.g., based on picking the symbol with the closest Euclidean distance to the SD output sample). The HD signals for the X-demodulator 210-1 and the Y-demodulator 210-2 are represented as: $D_0[\hat{X}_{HD}]$ and $D_0[\hat{Y}_{HD}]$, respectively.

In addition to (or as an alternative to) soft decision signals and hard decision signals, some embodiments generate one or more other types of decision signals 215, referred to herein as a "known" decision signal (i.e., $D_0[\hat{X}_{known}]$ and $D_0[\hat{Y}_{known}]$). One type of known decision signal is based on a set of previously known symbols at deterministic symbol locations. For example, as described above, data is encoded onto the X-signal and the Y-signal based on one or more protocols, such that a portion of the encoded data stream can include certain types of protocol-defined preamble symbols, header symbols, and/or other overhead symbols that follow protocol-defined patterns (e.g., sequences). In some embodiments, the H/KD blocks 318 can generate the known decision signal based completely on prior knowledge of must be transmitted by the transmitter in particular time locations (e.g., as defined by protocols, etc.), regardless of what is received at the demodulators 210. For example, input signals 205, SD output, etc. can be ignored when generating the known decision signals, and the generated known decision signals have symbol values only in known locations. In other embodiments, the H/KD blocks 318 can exploit prior knowledge of transmitted symbols in certain time locations to verify symbol recovery by the H/KD blocks 318, and/or to confidently recover symbols in those known time locations.

For example, in locations of the recovered symbol stream that correspond to such sequences of known symbols, the H/KD blocks 318 can be highly confident of the "correct" value of estimated recovered symbols.

Another type of known decision signal is generated to include estimated recovered symbols only where the estimate exceeds a predetermined threshold confidence level. For example, as described above, some soft decision techniques are based on Euclidean distance from constellation points. Some embodiments of the H/KD blocks 318 can generate a known decision signal to include estimated recovered symbol information only where the Euclidean distance to ideal constellation points is below a relatively low threshold distance. In other embodiments, the H/KD blocks 318 do not generate the known decision signal as a separate signal; rather, the H/KD blocks 318 can represent the known decision signals as indications of which portions of the HD signal represent high-confidence estimated recovered symbols (e.g., based on protocol definition, Euclidean distance, etc.).

As described below, the various types of decision signals 215 can be used by control loops of the LMSCs 220. In general, the SD and HD signals tend to have a relatively high symbol density, but relatively low confidence as to the values of the estimated recovered symbols; while the known decision signal can have an appreciably smaller symbol density, but an appreciably high confidence as to the values of the estimated recovered symbols. As such, use of the known decision signals in the LMSC 220 control loops may yield slower, but more confident conversion for interference cancelation.

One or more of the decision signals 215 from each of the demodulators 210 is sent to both of the LMSCs 220. Using these decision signals 215, the LMSCs 220 seek to cancel the portion of each of the input signals 205 that is correlated with the other of the input signals 205 to generate a respective one of the X-output signal 225-1 and the Y-output signal 225-2. For example, as described above, an output of the X-demodulator 210-1 (i.e., one or more of the decision signals 215) can essentially be the X-signal and the Y-cross polarization interference, received as the X-input signal 205-1, but after being at least normalized with respect to amplitude and phase from normalizer 312-1, delayed to the Do clock reference frame by STR block 314-1, and with improved SNR from MF block 316-1. One or more of the Y-decision signals 215-2 from the Y-demodulator 210-2 can then be used by the X-LMSC 220-1 to isolate and cancel the portions of the X-demodulator 210-1 output that correlate to the Y-cross-polarization interference, thereby leaving only (or substantially only) the X-signal information in the N-output signal 225-1.

As illustrated, the SD output signal from each demodulator 210 is provided as the input to its corresponding LMSC 220. Each LMSC 220 has a control loop (e.g., a first-order control loop) that includes a subtracter 322, a first multiplier 324, an integration-attenuation path having an integrator 326 and an attenuator 328, and a second multiplier 329. For example, in the X-LMSC 220-1, an X-subtracter 322-1 generates the X-output signal 225-1 based on a difference between the X-soft decision signal, $D_0[\hat{X}_{SD}]$, and an X-feedback signal generated at the output of the control loop. Each control loop effectively uses negative feedback to dynamically converge on cancellation of the cross-polarization interference.

A first X-multiplier 324-1 is coupled with the output of X-subtracter 322-1 to generate a first X-multiplier output signal based on a product of the X-output signal 255-1 and a conjugate of one of the Y-decision signals 215-2. In some implementations, the conjugate of the Y-hard decision signal (one possible output of H/KD block 318-2, $D_0[\hat{Y}_{HD}]$) is used by first multiplier 324-1. In other implementations, the conjugate of the Y-known decision signal (another possible output of H/KD block 318-2, $D_0[\hat{Y}_{known}]$) is used by first multiplier 324-1. As described above, the Y-known decision signal can be generated to include only known symbols based on protocol definitions and/or other highly deterministic portions of the received signal, or the Y-known decision signal can be generated otherwise to include only symbols that can be estimated with at least a predetermined threshold level of confidence. In some implementations, the Y soft decision signal (the output of MF block 316-2, $D_0[\hat{Y}_{SD}]$) can be used by first X-multiplier 324-1.

In an X-integration-attenuation path, an X-integrator 326-1 and an X-attenuator 328-1 are coupled with the output of first X-multiplier 324-1 to generate a second X-multiplier output signal by integrating and attenuating the first X-multiplier output signal (based on an attenuation factor, k). Though k is constant, the output of the X-attenuator 328-1 varies dynamically, as described below. For example, the second X-multiplier output signal can begin at a value appreciably less than 1 (e.g., $10^{-4}$, or less), and can adaptively converge substantially to an optimal value (e.g., to an estimate of ai) for canceling the cross-polarization interference contribution. A second X-multiplier 329-1 is coupled with the output of the X-integration-attenuation path to generate the X-feedback signal based on a product of the second X-multiplier output signal and one of the Y-symbol decision signals 215-2. In the illustrated implementation, the Y-soft decision signal is used by the second X-multiplier 329-1 to generate the X-feedback signal. In other implementations, the Y-hard decision signal can be used by the second X-multiplier 329-1 to generate the X-feedback signal. As illustrated, the output of the second X-multiplier 329-1 is coupled in feedback with an input of the X-subtracter 322-1.

As described above, the Y-signal contributes cross-polarization interference to the X-input signal 205-1 at a magnitude represented by cu. In effect, over multiple iterations of the control loop, the X-integration-attenuation path settles to a value that corresponds to an estimate of $\alpha_1$. As such, the X-feedback signal generated at the output of the control loop by the second X-multiplier 329-1 is an estimate of $\alpha_1 Y$, which is the Y-cross-polarization interference contribution on the X-input signal 205-1. By feeding this back and subtracting this out, the Y-cross-polarization interference contribution can effectively be removed from the X-input signal 205-1.

The Y-LMSC 220-2 can include the same components and can operate in the same manner. A Y-subtracter 322-2 generates the Y-output signal 225-2 based on a difference between the Y-soft decision signal, $D_0[\hat{Y}_{SD}]$, and a Y-feedback signal generated at the output of the control loop. A first Y-multiplier 324-2 is coupled with the output of Y-subtracter 322-2 to generate a first Y-multiplier output signal based on a product of the Y-output signal 255-2 and a conjugate of one of the X-decision signals 215-1 (e.g., a conjugate of the X-hard decision signal, the X-known decision signal, the X-soft decision signal, etc.). In a Y-integration-attenuation path, a Y-integrator 326-2 and a Y-attenuator 328-2 are coupled with the output of first Y-multiplier 324-2 to generate a second Y-multiplier output signal by integrating and attenuating the first Y-multiplier output signal. A second Y-multiplier 329-2 is coupled with the output of the Y-integration-attenuation path to generate the Y-feedback signal based on a product of the second Y-multiplier output signal and one of the X-symbol decision signals 215-1 (e.g., the X-soft decision signal, or the X-hard decision signal). The output of the second Y-multiplier 329-2 is coupled in feedback with an input of the Y-subtracter 322-2. The X-signal contributes cross-polarization interference to the Y-input signal 205-2 at a magnitude represented by $\alpha_2$, and the Y-integration-attenuation path is configured adaptively to settle to a value that corresponds to an estimate of $\alpha_2$. As such, the Y-feedback signal generated at the output of the control loop by the second X-multiplier 329-1 is an estimate of $\alpha_2 X$ (the X-cross-polarization interference contribution on the Y-input signal 205-2), and feeding this back and subtracting this out can effectively remove the Y-cross-polarization interference contribution from the X-input signal 205-1.

Figure 4:
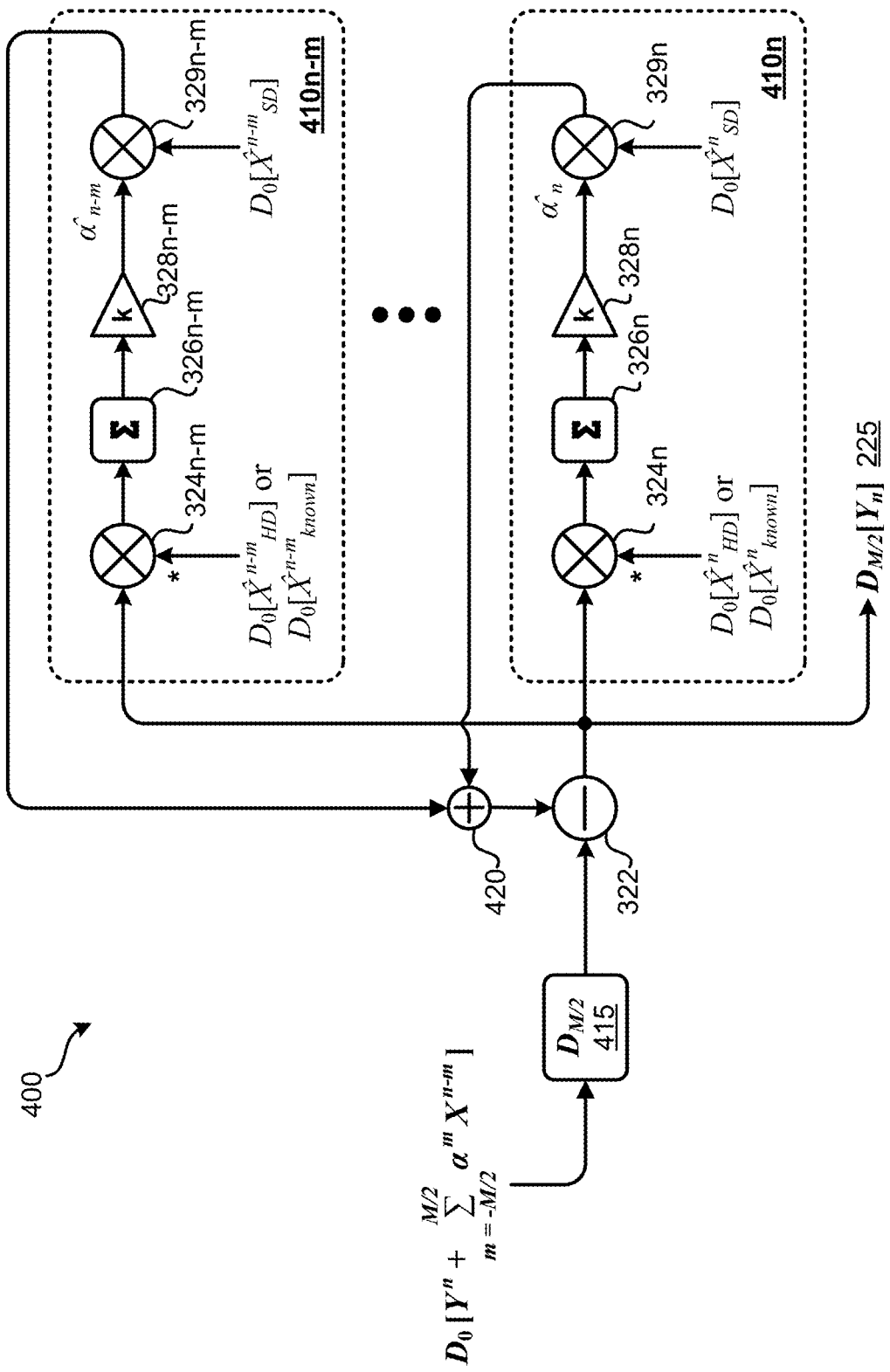
FIG. 4 shows a block diagram of an implementation of an illustrative multi-tap canceler for cancelation of cross-polarization interference, according to various embodiments described herein.

FIG. 4 shows a block diagram of an implementation of an illustrative multi-tap LMSC 400 for cancelation of cross-polarization interference, according to various embodiments described herein. Such a multi-tap approach can tend to handle more delay mismatch between the X-signal and the Y-signal than can a single-tap approach. The multi-tap LMSC 400 approach can operate on multiple samples in parallel (i.e., concurrently) by associating each of multiple taps 410 to a respective sample time. Each input signal 205 is encoded at a particular symbol data rate, such that each symbol has a defined symbol time, symbol boundary, etc., and each decision signal 215 output by the demodulators 210 can be generated at the same symbol rate, or some multiple thereof. In some implementations, each of the taps 410 is assigned in integer symbol time increments, so that each tap is effectively operating on a version of the signal that is delayed by a corresponding integer number of symbol times. In other implementations, one or more the decision signals 215 output by the demodulators 210 are oversampled with respect to the symbol rate of the input signals 205 by generating samples (i.e., an estimated symbol recovery sample) at a sample rate that is a multiple of the symbol rate. For example, the sample rate of the decision signals 215 can be 4×, 10×, 16×, or any other suitable rate, such that each symbol time corresponds to 4 sample times (i.e., 4 samples, each having a corresponding sample time), 10 sample times, 16 sample times, or any other suitable number of sample times, respectively. In such cases, each tap 410 can be assigned to a respective sample time, which can be a fraction of a symbol time.

In general, the multi-tap LMSC 400 includes a "tap" 410 for each of at least some of the sample times, such that the multi-tap LMSC 400 can be implemented with M taps 410, M is a positive integer. For example, when M=1, the multi-tap LMSC 400 devolves to a single-tap LMSC, such as the one illustrated in FIG. 3. To avoid overcomplicating the figure, only two taps are shown. Each tap 410 can be implemented in substantially the same manner, and any suitable number of taps 410 can be used. Further, to avoid overcomplicating the figure, FIG. 4 shows signals corresponding only to an implementation of the multi-tap LMSC 400 as a Y-LMSC, and the following description similarly refers to the illustrated implementation as a Y-LMSC. It will be appreciated that the same approach can be used to implement an X-LMSC by replacing all 'X's with 'Y's in FIG. 4, and replacing all 'Y's with 'X's in FIG. 4. For example, in some embodiments of FIG. 3, each of the X-LMSC 220-1 and the Y-LMSC 220-2 is implemented as a single-tap LMSC in the manner illustrated. In other embodiments, each of the X-LMSC 220-1 and the Y-LMSC 220-2 of FIG. 3 is illustrated to represent only a single representative tap 410 of respective multi-tap LMSC 400 implementations.

As illustrated in FIG. 4, the input to the multi-tap LMSC 400 is similar to the input to the LMSCs 220 described in FIGS. 2 and 3, except for an explicit representation of the multiple sample times (m) for the signal. Using M taps 410, the multi-tap LMSC 400 can handle delays of up to M/2 sample times between the X signal and the Y signal. As noted above, the SD outputs from both demodulators 210 are aligned to a common demodulator clock domain, $D_0$. However, that alignment may not account for delays of one or more symbols (e.g., or one or more samples) between the X-signal and the Y-signal. Such inter-signal delay will manifest as a corresponding delay in each SD output signal between the symbol-related information and the cross-polarization interference. For example, as illustrated at the input to the multi-tap LMSC 400, at any time index, n, the Y-channel SD output signal ($D_0[\hat{Y}_{SD}]$) includes symbol information from the Y-signal ($Y^n$) and cross-polarization interference contributions from the X-signal. The cross-polarization interference contributions from the X-signal can include aggregate contributions from one or more of M total sample times ($X^{n-m}$), each having a respective magnitude of $\alpha^m$. If the amount of delay between the Y-signal and the X-signal (i.e., $D_2$-$D_1$) corresponds to an integer number of sample times, it can be seen that there may be only a single non-zero $\alpha^m$ at the output of the MF blocks 216 of the demodulators 210. However, if the delay is not an integer number of symbol times, there can tend to be more than one non-zero $\alpha^m$, and the sum of those non-zero interference contributions can effectively add to produce an overall interference contribution. A delay block 415 is added at the input to the multi-tap LMSC 400 to effectively shift the input to the multi-tap LMSC 400 (i.e., the SD output signal from the Y-demodulator 210-2, in the illustrated case), so that the M taps 410 of the multi-tap LMSC 400 correspond to a symmetric set of delays (e.g., from the X-signal to the Y-signal) between m=−M/2 to m=+M/2.

Similar to the LMSCs 220-2 described with reference to FIG. 3, the multi-tap LMSC 400 includes a subtracter 322 to generate the output signal 225 (e.g., the Y-output signal 225-2) based on a difference between the input signal represented above (e.g., corresponding to the soft decision signal), and a feedback signal. It can be seen that the Y-output signal 225-2 at the output of the multi-tap LMSC 400 is delayed by M/2 samples corresponding to the delay imposed by the delay block 415 at the input to the multi-tap LMSC 400. Unlike in FIG. 3, where only a single feedback signal is illustrated in each LMSC 220 as being fed back from a single control loop, the feedback signal in the multi-tap LMSC 400 is an aggregate of respective feedback signals generated by each of taps 410 of the multi-tap LMSC 400. As illustrated, the multi-tap LMSC 400 includes an aggregation node 420 that receives the respective feedback signals from the multiple taps 410, and outputs an aggregated feedback signal based on a sum of the received respective feedback signals. Thus, the output signal 255 is generated by the subtracter 322 based on a difference between the input signal and the aggregated feedback signal.

Each tap 410 includes a respective control loop that can be implemented in substantially the same manner as the control loops of the LMSCs 220 of FIG. 3. A first Y-multiplier 324-2 is coupled with the output of Y-subtracter 322-2 to generate a first Y-multiplier output signal based on a product of the Y-output signal 255-2 and a conjugate of one of the X-decision signals 215-1. As noted above, the X-decision signal 215-1 for which the conjugate is used by the first Y-multiplier 324-2 can be the X-hard decision signal, the X-known decision signal, the X-soft decision signal, etc. In a Y-integration-attenuation path, a Y-integrator 326-2 and a Y-attenuator 328-2 are coupled with the output of first Y-multiplier 324-2 to generate a second Y-multiplier output signal by integrating and attenuating the first Y-multiplier output signal. A second Y-multiplier 329-2 is coupled with the output of the Y-integration-attenuation path to generate the Y-feedback signal based on a product of the second Y-multiplier output signal and a same or different one of the X-symbol decision signals 215-1 (e.g., the X-soft decision signal, or the X-hard decision signal).

As noted above, each tap 410 is associated with a corresponding one of the M sample times. As such, as illustrated, any X-decision signal 215-1 used by an mth tap 410 is actually one of M sampled versions of that X-decision signal 215-1 corresponding to the mth sample time, as denoted by a superscript on the illustrated signal. Similarly, the Y-integration-attenuation path in each mth tap 410 is configured adaptively to converge to an estimate of a magnitude of cross-polarization interference contribution coming from X-signal samples in the corresponding sample time. Thus, the output of the second Y-multiplier 329-2 (i.e., the respective feedback signal generated by each tap 410) represents the portion of the cross-polarization interference contribution at the respective sample time attenuated by the respective attenuation factor for that sample time. That respective feedback signal can then be fed back to the aggregation node 420 for aggregation with the other partial interference contributions from the other sample times.

Figure 5:
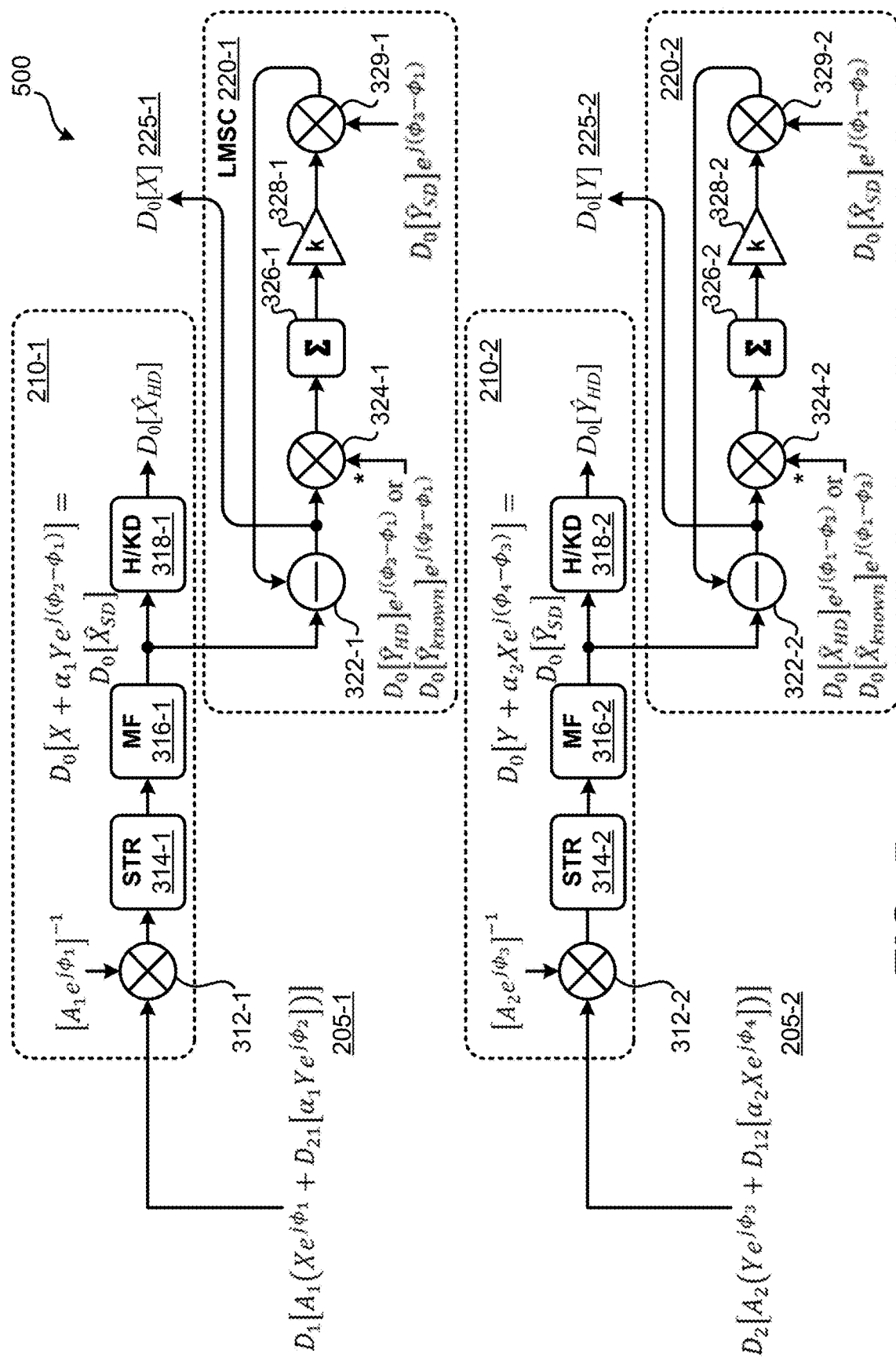
FIG. 5 shows a block diagram of an illustrative implementation of a partial radiofrequency receiver to handle frequency offsets between the X-signal and the Y-signal, according to various embodiments described herein.

FIG. 5 shows a block diagram of an illustrative implementation of a partial radiofrequency receiver 500 to handle frequency offsets between the X-signal and the Y-signal, according to various embodiments described herein. The partial radiofrequency receiver 500 can be an implementation of the partial radiofrequency receiver 200 of FIG. 2, or the partial radiofrequency receiver 300 of FIG. 3. Further, the partial radiofrequency receiver 500 illustrated in FIG. 5 can be implemented with multi-tap LMSCs, such as in accordance with implementations described with reference to FIG. 4. The various components shown in FIG. 5 can be implemented in a substantially identical manner to the corresponding components of FIG. 3, except that the signal inputs and output are adapted to handle frequency offsets between the X-signal and the Y-signal, which can manifest as a time-varying phase. The input signals 205 are represented as:

$$D_1[A_1(Xe^{j\phi_1}+D_{21}[\alpha_1 Ye^{j\phi_5}])], \text{ and}$$

$$D_2[A_2(Ye^{j\phi_2}+D_{12}[\alpha_1 Xe^{j\phi_5}])].$$

For example, as described above, the X-input signal 205-1 includes the X-signal with the addition of cross-polarization interference contributions from the Y-signal at a magnitude represented by $\alpha_1$, all with an amplitude ($A_1$) and a delay ($D_1$). Additionally, The X-signal contribution has a particular associated phase ($\phi_1$), and the Y-cross-polarization interference contribution has a potentially different associated phase ($\phi_2$) respective to $\phi_1$. Similarly, the Y-input signal 205-2 includes the Y-signal with the addition of cross-polarization interference contributions from the X-signal at a magnitude represented by $\alpha_2$, all with an amplitude ($A_2$) and a delay ($D_2$). Additionally, The Y-signal contribution has a particular associated phase ($\phi_3$), and the X-cross-polarization interference contribution has a potentially different associated phase ($\phi_4$) respective to $\phi_3$. In general $\phi_1$ and $\phi_3$ are time varying, while the $\phi_2$ represents a constant phase offset relative to $\phi_3$, and $\phi_4$ represents a constant phase offset relative to $\phi_1$.

In each demodulator 210, generated decision signals 215 retain the time varying phase offsets between each respective signal and its respective cross-polarization interference contributions. For example, in the X-soft decision signal output by the X-demodulator 210-1, the Y-cross-polarization interference contribution is indicated as retaining an associated phase offset of the time-varying difference between $\phi_2$ and $\phi_1$. Thus, each LMSC 220 is configured to cancel the cross-polarization interference contributions, even in presence of such a time varying offset, by using non-correlated decision signals 215 that also include the time-varying phase offsets. As noted above, $\phi_1$ is the phase of the X-signal as received by the receiver, and $\phi_3$ is the phase of the Y-signal as received by the receiver. As such, the difference between $\phi_1$ and $\phi_3$ is the phase difference between the demodulators 210 after normalization of the respective input signals 205. For example, the first X-multiplier 322-1 and the second X-multiplier 329-1 in the X-LMSC 220-1 can each generate their outputs based on the same or different Y-decision signals 215-2; but the variable phase offset between the Y-signal and the X-signal (i.e., $\phi_3-\phi_1$) is applied to whichever of the Y-decision signals 215-2 is used. Similarly, the first Y-multiplier 322-2 and the second Y-multiplier 329-2 in the Y-LMSC 220-2 can each generate their outputs based on the same or different X-decision signals 215-1; but the variable phase offset between the X-signal and the Y-signal (i.e., $\phi_1-\phi_3$) is applied to whichever of the X-decision signals 215-1 is used. As such, the feedback signal generated by each LMSC 220 accounts for the time-varying phase offset, thereby properly canceling the time-varying interference contributions.

Figure 6:
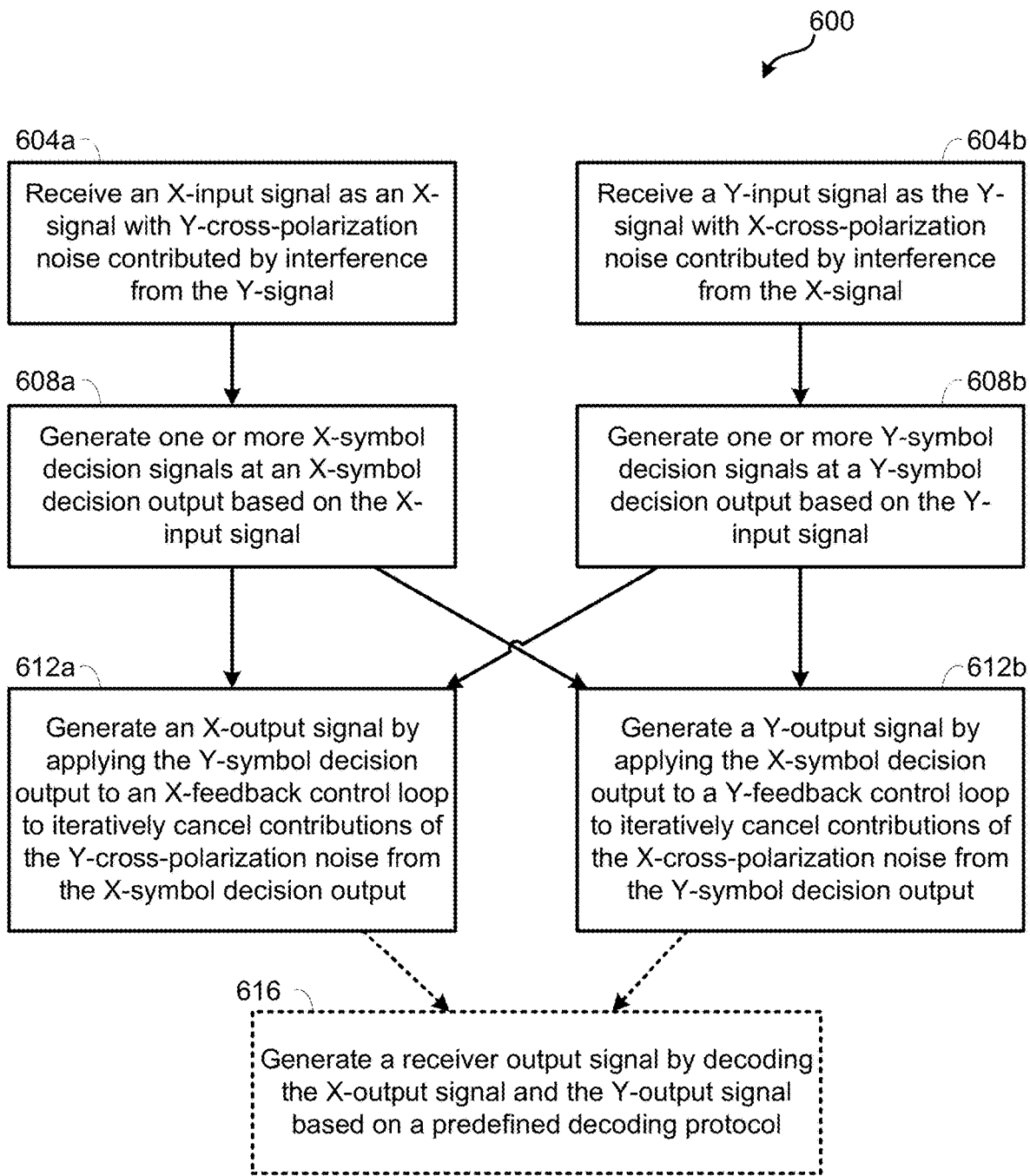
FIG. 6 shows a flow diagram of an illustrative method for cancelation of cross-polarization interference in a radiofrequency receiver, according to various embodiments described herein.

FIG. 6 shows a flow diagram of an illustrative method 600 for cancelation of cross-polarization interference in a radiofrequency receiver, according to various embodiments described herein. Embodiments of the method 600 can be implemented using any of the systems described above, and/or any other suitable system. As described herein, embodiments assume that the radiofrequency receiver is simultaneously receiving an X-signal in a first polarization and a Y-signal in a second polarization over a same frequency channel, and that the first polarization is nominally orthogonal to the second polarization. For example, the X-signal and the Y-signal are effectively simultaneous two instances of a same communication that are transmitted in different polarizations for increased spectral efficiency. Embodiments of the method 600 begin at stages 604a and 604b by receiving an X-input signal as the X-signal with Y-cross-polarization interference contributed by interference from the Y-signal, and receiving a Y-input signal as the Y-signal with X-cross-polarization interference contributed by interference from the X-signal, respectively.

At stage 608a, embodiments can generate one or more X-symbol decision signals at an X-symbol decision output based on the X-input signal. Similarly, at stage 608b, embodiments can generate one or more Y-symbol decision signals at a Y-symbol decision output based on the Y-input signal. In some embodiments, the X-input signal is received with an X-input delay, and the Y-input signal is received with a Y-input delay. In such embodiments, the generating the one or more X-symbol decision signals at stage 608a can include synchronizing the one or more X-symbol decision signals to a demodulator clock domain, and the generating the one or more Y-symbol decision signals at stage 608b can include synchronizing the one or more Y-symbol decision signals to the demodulator clock domain.

At stage 612*a*, embodiments can generate an X-output signal by applying the Y-symbol decision output to an X-feedback control loop to adaptively cancel contributions of the Y-cross-polarization interference from the X-symbol decision output. Similarly, at stage 612*b*, embodiments can generate a Y-output signal by applying the X-symbol decision output to a Y-feedback control loop to adaptively cancel contributions of the X-cross-polarization interference from the Y-symbol decision output. In some embodiments, generating the X-output signal at stage 612*a* includes (in a loop-wise fashion, adaptively): generating the X-output signal based on a difference between one of the one or more X-symbol decision signals and an X-feedback signal; generating a first X-multiplier output signal based on a product of the X-output signal and a conjugate of a first of the one or more Y-symbol decision signals; generating a second X-multiplier output signal by integrating and attenuating the first X-multiplier output signal; and generating the X-feedback signal based on a product of the second X-multiplier output signal and a second of the one or more Y-symbol decision signals. Similarly, in such embodiments, generating the Y-output signal at stage 612*b* can include (in a loop-wise fashion, adaptively): generating the Y-output signal based on a difference between one of the one or more Y-symbol decision signals and a Y-feedback signal; generating a first Y-multiplier output signal based on a product of the Y-output signal and a conjugate of a first of the one or more X-symbol decision signals; generating a second Y-multiplier output signal by integrating and attenuating the first Y-multiplier output signal; and generating the Y-feedback signal based on a product of the second Y-multiplier output signal and a second of the one or more X-symbol decision signals.

As described herein, the first of the one or more X-symbol decision signals can be any of an X-soft decision output signal generated based on applying symbol timing recovery to the X-input signal, an X-hard decision output signal generated based on the X-soft decision output signal, an X-known decision output signal generated based on recovery of a protocol-defined symbol set from the X-input signal, an X-known decision output signal generated based on a subset of symbols recovered from the X-input signal with at least a predetermined threshold confidence level, and/or another suitable X-symbol decision signal. Similarly, the first of the one or more Y-symbol decision signals can be any of an Y-soft decision output signal generated based on applying symbol timing recovery to the Y-input signal, an Y-hard decision output signal generated based on the Y-soft decision output signal, an Y-known decision output signal generated based on recovery of a protocol-defined symbol set from the Y-input signal, an Y-known decision output signal generated based on a subset of symbols recovered from the Y-input signal with at least a predetermined threshold confidence level, and/or another suitable Y-symbol decision signal. The second of the one or more X-symbol decision signals can be the same as, or different from, the first of the one or more X-symbol decision signals. For example, the second of the X-soft decision output signal or the X-hard decision output signal. Similarly, the second of the one or more Y-symbol decision signals can be the same as, or different from, the first of the one or more Y-symbol decision signals. For example, the second of the Y-soft decision output signal or the Y-hard decision output signal.

In some such embodiments, the X-signal is received in stage 604*a* at a first phase, and the Y-signal is received in stage 604*b* at a second phase; generating the first X-multiplier output signal is based on the product of the X-output signal and the conjugate of the first of the one or more Y-symbol decision signals with a first applied phase offset corresponding to a difference between the second phase and the first phase; and generating the first Y-multiplier output signal based on the product of the Y-output signal and the conjugate of the first of the one or more X-symbol decision signals with a second applied phase offset corresponding to a difference between the first phase and the second phase. In some such embodiments, the X-input signal and the Y-input signal both encode a stream of symbols at a symbol rate, one or more of the X-symbol decision signals and Y-symbol decision signals are generated to include X-decision samples of the symbols at a sample rate. In some implementations, the sample rate corresponds to the symbol rate, such that there is one sample per symbol. In other implementations, the sample rate is a multiple of the symbol rate, or the like, such that there are multiple samples per symbol. In such embodiments, generating the X-output signal at stage 612*a* can include: receiving the X-feedback signal as M X-feedback signals (M being a positive integer greater than 1); generating an aggregated X-feedback signal based on a sum of the M X-feedback signals; generating the X-output signal based on a difference between one of the one or more X-symbol decision signals and the aggregated X-feedback signal; and generating each mth X-feedback signal of the M X-feedback signals. Each mth X-feedback signal can be generated by: generating an mth first X-multiplier output signal based on a product of the X-output signal and a conjugate of a mth-delayed version of a first of the one or more Y-symbol decision signals corresponding to an mth sampling location of the Y-decision samples (e.g., delayed by m samples relative to the other versions); generating an mth second X-multiplier output signal by integrating and attenuating the respective mth X-multiplier output signal; and generating the mth X-feedback signal based on a product of the mth second X-multiplier output signal and a mth-delayed version of a second of the one or more Y-symbol decision signals corresponding to the mth sampling location of the Y-decision samples. Similarly, in such embodiments, generating the Y-output signal at stage 612*b* can include: receiving the Y-feedback signal as M Y-feedback signals; generating an aggregated Y-feedback signal based on a sum of the M Y-feedback signals; generating the Y-output signal based on a difference between one of the one or more Y-symbol decision signals and the aggregated Y-feedback signal; and generating each mth Y-feedback signal of the M Y-feedback signals. Each mth Y-feedback signal can be generated by: generating an mth first Y-multiplier output signal based on a product of the Y-output signal and a conjugate of a mth-delayed version of a first of the one or more X-symbol decision signals corresponding to an mth sampling location of the X-decision samples; generating an mth second Y-multiplier output signal by integrating and attenuating the respective mth Y-multiplier output signal; and generating the mth Y-feedback signal based on a product of the mth second Y-multiplier output signal and a mth-delayed version of a second of the one or more X-symbol decision signals corresponding to the mth sampling location of the X-decision samples.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered.

What is claimed is:

1. A system for cancelation of cross-polarization interference in a radiofrequency receiver that simultaneously receives an X-signal in a first polarization and a Y-signal in a second polarization over a same frequency channel, the first polarization being nominally orthogonal to the second polarization, the system comprising:
    an X-demodulator to receive an X-input signal and to generate one or more X-symbol decision signals at an X-symbol decision output based on the X-input signal, the X-input signal being the X-signal with Y-cross-polarization interference contributed by interference from the Y-signal;
    a Y-demodulator to receive a Y-input signal and to generate one or more Y-symbol decision signals at a Y-symbol decision output based on the Y-input signal, the Y-input signal being the Y-signal with X-cross-polarization interference contributed by interference from the X-signal;
    an X-channel adaptive canceler (X-CAC) coupled with the X-demodulator and the Y-demodulator, and comprising a first least mean squares (LMS) control loop including: an X-subtracter to generate an X-output signal based on a difference between an X-soft decision output signal and an X-feedback signal; a first X-multiplier to generate a first X-multiplier output signal based on a product of the X-output signal and a conjugate of a first of the one or more Y-symbol decision signals; an X-integration-attenuation path to generate a second X-multiplier output signal by integrating and attenuating the first X-multiplier output signal; and a second X-multiplier to generate the X-feedback signal based on a product of the second X-multiplier output signal and a second of the one or more Y-symbol decision signals; and
    a Y-channel adaptive canceler (Y-CAC) coupled with the X-demodulator and the Y-demodulator, and comprising a second least mean squares (LMS) control loop including: a Y-subtracter to generate a Y-output signal based on a difference between a Y-soft decision output signal and a Y-feedback signal; a first Y-multiplier to generate a first Y-multiplier output signal based on a product of the Y-output signal and a conjugate of a first of the one or more X-symbol decision signals; a Y-integration-attenuation path to generate a second Y-multiplier output signal by integrating and attenuating the first Y-multiplier output signal; and a second Y-multiplier to generate the Y-feedback signal based on a product of the second Y-multiplier output signal and a second of the one or more X-symbol decision signals.

2. The system of claim 1, further comprising:
a demodulator clock coupled with the X-demodulator and the Y-demodulator and defining a demodulator clock domain,
wherein the X-demodulator is to receive the X-input signal with an X-input delay and to generate the one or more X-symbol decision signals as synchronized to the demodulator clock domain, and
the Y-demodulator is to receive the Y-input signal with a Y-input delay and to generate the one or more Y-symbol decision signals as synchronized to the demodulator clock domain.

3. The system of claim 1, wherein:
the X-demodulator comprises a first symbol timing recovery block and a first matched filter block to generate the one or more X-symbol decision signals to include the X-soft decision output signal based on the X-input signal; and
the Y-demodulator comprises a second symbol timing recovery block and a second matched filter block to generate the one or more Y-symbol decision signals to include the Y-soft decision output signal based on the Y-input signal.

4. The system of claim 1, wherein:
the second of the one or more X-symbol decision signals is the X-soft decision output signal; and
the second of the one or more Y-symbol decision signals is the Y-soft decision output signal.

5. The system of claim 1, wherein:
the first of the one or more X-symbol decision signals is the X-soft decision output signal; and
the first of the one or more Y-symbol decision signals is the Y-soft decision output signal.

6. The system of claim 1, wherein:
the X-demodulator further comprises a first hard decision block to generate the one or more X-symbol decision signals further to include an X-hard decision output signal based on the X-soft decision output signal;
the Y-demodulator further comprises a second hard decision block to generate one or more Y-symbol decision signals further to include a Y-hard decision output signal based on the Y-soft decision output signal;

the first of the one or more X-symbol decision signals is the X-hard decision output signal; and the first of the one or more Y-symbol decision signals is the Y-hard decision output signal.

7. The system of claim 1, wherein:
the X-demodulator is to generate the one or more X-symbol decision signals further to include an X-known decision output signal based on a predetermined symbol set;
the Y-demodulator is to generate the one or more Y-symbol decision signals further to include a Y-known decision output signal based on the predetermined symbol set;
the first of the one or more X-symbol decision signals is the X-known decision output signal; and
the first of the one or more Y-symbol decision signals is the Y-known decision output signal.

8. The system of claim 1, wherein:
the X-demodulator is to generate the one or more X-symbol decision signals further to include an X-known decision output signal based on a subset of symbols recovered from the X-input signal with at least a predetermined threshold confidence level;
the Y-demodulator is to generate the one or more Y-symbol decision signals further to include a Y-known decision output signal based on a subset of symbols recovered from the Y-input signal with at least the predetermined threshold confidence level;
the first of the one or more X-symbol decision signals is the X-known decision output signal; and
the first of the one or more Y-symbol decision signals is the Y-known decision output signal.

9. The system of claim 1, wherein:
the X-input signal and the Y-input signal encode streams of symbols at a symbol rate;
the X-demodulator is to generate the X-soft decision output signal to include one or more X-soft decision samples per symbol of the X-input signal, and the Y-demodulator is to generate the Y-soft decision output signal to include one or more Y-soft decision samples per symbol of the Y-input signal;
the X-CAC further comprises:
an X-aggregation node to receive M X-feedback signals and to generate an aggregated X-feedback signal based on a sum of the M X-feedback signals, where M is a positive integer greater than 1,
wherein the X-subtracter is to generate the X-output signal based on a difference between the X-soft decision output signal and the aggregated X-feedback signal; and
M X-feedback loops, each comprising an instance of the first X-multiplier, an instance of the X-integration-attenuation path, and an instance of the second X-multiplier, each mth X-feedback loop to generate a respective one of the M X-feedback signals based on mth-delayed versions of the one or more Y-symbol decision signals corresponding to an mth sampling location of the Y-soft decision samples; and
the Y-CAC further comprises:
a Y-aggregation node to receive M Y-feedback signals and to generate an aggregated Y-feedback signal based on a sum of the M Y-feedback signals,
wherein the Y-subtracter is to generate the Y-output signal based on a difference between the Y-soft decision output signal and the aggregated Y-feedback signal; and
M Y-feedback loops, each comprising an instance of the first Y-multiplier, an instance of the Y-integration-attenuation path, and an instance of the second Y-multiplier, each mth X-feedback loop to generate a respective one of the M Y-feedback signals based on mth-delayed versions of the one or more X-symbol decision signals corresponding to an mth sampling location of the X-soft decision samples.

10. The system of claim 1, wherein:
the X-signal is received at a first phase, and the Y-signal is received at a second phase;
the first X-multiplier is to generate the first X-multiplier output signal based on the product of the X-output signal and the conjugate of the first of the one or more Y-symbol decision signals with a first applied phase offset corresponding to a difference between the second phase and the first phase; and
the first Y-multiplier is to generate the first Y-multiplier output signal based on the product of the Y-output signal and the conjugate of the first of the one or more X-symbol decision signals with a second applied phase offset corresponding to a difference between the first phase and the second phase.

11. The system of claim 1, wherein:
the X-CAC comprises a first second-order control loop; and
the Y-CAC comprises a second second-order control loop.

12. The system of claim 1, wherein:
the X-demodulator further comprises a first signal normalization block to estimate and cancel an amplitude and phase of the X-input signal to generate a normalized X-input signal, and the X-demodulator is to generate the one or more X-symbol decision signals based on the normalized X-input signal; and
the Y-demodulator further comprises a second signal normalization block to estimate and cancel an amplitude and phase of the Y-input signal to generate a normalized Y-input signal, and the Y-demodulator is to generate the one or more Y-symbol decision signals at based on the normalized Y-input signal.

13. The system of claim 1, further comprising:
a receiver decoder block to generate a receiver output signal by decoding the X-output signal and the Y-output signal based on a predefined decoding protocol.

14. A method for cancelation of cross-polarization interference in a radiofrequency receiver that simultaneously receives an X-signal in a first polarization and a Y-signal in a second polarization over a same frequency channel, the first polarization being nominally orthogonal to the second polarization, the method comprising:
receiving an X-input signal as the X-signal with Y-cross-polarization interference contributed by interference from the Y-signal;
receiving a Y-input signal as the Y-signal with X-cross-polarization interference contributed by interference from the X-signal;
generating one or more X-symbol decision signals at an X-symbol decision output based on the X-input signal;
generating one or more Y-symbol decision signals at a Y-symbol decision output based on the Y-input signal;
generating an X-output signal based on a difference between one of the one or more X-symbol decision signals and an X-feedback signal,
wherein the X-feedback signal is generated by generating a first X-multiplier output signal based on a product of the X-output signal and a conjugate of a first of the one or more Y-symbol decision signals, generating a second X-multiplier output signal by integrating and attenuating the first X-multiplier output signal, and generating the X-feedback signal based on a product of the second X-multiplier output signal and a second of the one or more Y-symbol decision signals; and generating a Y-output signal based on a difference between one of the one or more Y-symbol decision signals and a Y-feedback signal, wherein the Y-feedback signal is generated by generating a first Y-multiplier output signal based on a product of the Y-output signal and a conjugate of a first of the one or more X-symbol decision signals, generating a second Y-multiplier output signal by integrating and attenuating the first Y-multiplier output signal, and generating the Y-feedback signal based on a product of the second Y-multiplier output signal and a second of the one or more X-symbol decision signals.

15. The method of claim 14, wherein:
the X-input signal is received with an X-input delay, and the Y-input signal is received with a Y-input delay;
generating the one or more X-symbol decision signals comprises synchronizing the one or more X-symbol decision signals to a demodulator clock domain; and
generating the one or more Y-symbol decision signals comprises synchronizing the one or more Y-symbol decision signals to the demodulator clock domain.

16. The method of claim 14, wherein:
the X-signal is received at a first phase, and the Y-signal is received at a second phase;
generating the first X-multiplier output signal is based on the product of the X-output signal and the conjugate of the first of the one or more Y-symbol decision signals with a first applied phase offset corresponding to a difference between the second phase and the first phase; and
generating the first Y-multiplier output signal based on the product of the Y-output signal and the conjugate of the first of the one or more X-symbol decision signals with a second applied phase offset corresponding to a difference between the first phase and the second phase.

17. The method of claim 14, wherein:
the X-input signal and the Y-input signal encode streams of symbols at a symbol rate;
the one or more X-symbol decision signals are generated at a sample rate to include one or more X-decision samples per symbol of the X-input signal, and the one or more Y-symbol decision signals are generated at the sample rate to include one or more Y-decision samples per symbol of the Y-input signal;
generating the X-output signal comprises:
  receiving the X-feedback signal as M X-feedback signals, where M is a positive integer greater than 1;
  generating an aggregated X-feedback signal based on a sum of the M X-feedback signals;
  generating the X-output signal based on a difference between one of the one or more X-symbol decision signals and the aggregated X-feedback signal; and
  generating each mth X-feedback signal of the M X-feedback signals by:
    generating an mth first X-multiplier output signal based on a product of the X-output signal and a conjugate of a mth-delayed version of a first of the one or more Y-symbol decision signals corresponding to an mth sampling location of the Y-decision samples;
    generating an mth second X-multiplier output signal by integrating and attenuating the respective mth X-multiplier output signal; and
    generating the mth X-feedback signal based on a product of the mth second X-multiplier output signal and a mth-delayed version of a second of the one or more Y-symbol decision signals corresponding to the mth sampling location of the Y-decision samples; and
generating the Y-output signal comprises:
  receiving the Y-feedback signal as M Y-feedback signals;
  generating an aggregated Y-feedback signal based on a sum of the M Y-feedback signals;
  generating the Y-output signal based on a difference between one of the one or more Y-symbol decision signals and the aggregated Y-feedback signal; and
  generating each mth Y-feedback signal of the M Y-feedback signals by:
    generating an mth first Y-multiplier output signal based on a product of the Y-output signal and a conjugate of a mth-delayed version of a first of the one or more X-symbol decision signals corresponding to an mth sampling location of the X-decision samples;
    generating an mth second Y-multiplier output signal by integrating and attenuating the respective mth Y-multiplier output signal; and
    generating the mth Y-feedback signal based on a product of the mth second Y-multiplier output signal and a mth-delayed version of a second of the one or more X-symbol decision signals corresponding to the mth sampling location of the X-decision samples.

18. The method of claim 14, wherein:
the first of the one or more X-symbol decision signals is one of:
  a X-soft decision output signal generated based on applying symbol timing recovery to the X-input signal;
  an X-hard decision output signal generated based on an X-soft decision output signal;
  an X-known decision output signal generated based on recovery of a protocol-defined symbol set from the X-input signal; or
  an X-known decision output signal generated based on a subset of symbols recovered from the X-input signal with at least a predetermined threshold confidence level; and
the first of the one or more Y-symbol decision signals is one of:
  a Y-soft decision output signal generated based on applying symbol timing recovery to the Y-input signal;
  a Y-hard decision output signal generated based on a Y-soft decision output signal;
  a Y-known decision output signal generated based on recovery of a protocol-defined symbol set from the Y-input signal; or
  a Y-known decision output signal generated based on a subset of symbols recovered from the Y-input signal with at least a predetermined threshold confidence level.

19. The method of claim 14, further comprising:
generating a receiver output signal by decoding the X-output signal and the Y-output signal based on a predefined decoding protocol.

* * * * *